United States Patent
Takebayashi et al.

(10) Patent No.: US 12,340,990 B2
(45) Date of Patent: Jun. 24, 2025

(54) MEMBER FOR SEMICONDUCTOR MANUFACTURING APPARATUS

(71) Applicant: NGK Insulators, Ltd., Nagoya (JP)

(72) Inventors: Hiroshi Takebayashi, Handa (JP); Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 349 days.

(21) Appl. No.: 18/158,021

(22) Filed: Jan. 23, 2023

(65) Prior Publication Data

US 2023/0290622 A1   Sep. 14, 2023

(30) Foreign Application Priority Data

Mar. 8, 2022   (JP) .................... 2022-035115

(51) Int. Cl.
*H01J 37/32* (2006.01)
*H01L 21/683* (2006.01)
*H01L 21/687* (2006.01)

(52) U.S. Cl.
CPC .. *H01J 37/32724* (2013.01); *H01J 37/32642* (2013.01); *H01L 21/6833* (2013.01);
(Continued)

(58) Field of Classification Search
CPC ........... H01J 37/32724; H01J 37/32642; H01J 2237/002; H01J 2237/2007;
(Continued)

(56) References Cited

U.S. PATENT DOCUMENTS

| 2015/0036261 | A1 | 2/2015 | Jindo et al. |
| 2015/0077895 | A1 | 3/2015 | Jindo et al. |
| 2020/0294838 | A1* | 9/2020 | Yoshikawa ........... C23C 16/466 |

FOREIGN PATENT DOCUMENTS

| CN | 114823459 A | * 7/2022 | ......... H01L 21/6838 |
| JP | 5666748 B1 | 2/2015 | |

(Continued)

*Primary Examiner* — Jared Fureman
*Assistant Examiner* — Daniel R Schwarck
(74) *Attorney, Agent, or Firm* — BURR PATENT LAW, PLLC

(57) ABSTRACT

A member for a semiconductor manufacturing apparatus, includes: a base substrate that has a wafer-placement-table support and a focus-ring-placement-table support; a focus-ring placement table that is joined to the focus-ring-placement-table support; a wafer placement table that is separate from the focus-ring placement table, that overlaps an inner peripheral portion of the focus-ring placement table in plan view, and that is joined to the inner peripheral portion of the focus-ring placement table and to the wafer-placement-table support; an internal space that is surrounded by a lower surface of the wafer placement table, an outer peripheral surface of the wafer-placement-table support, an inner peripheral surface of the focus-ring placement table, and an upper surface of the focus-ring-placement-table support; and a communication path that is provided at the base substrate and that causes the internal space and an outside of the base substrate to communicate with each other.

9 Claims, 11 Drawing Sheets

(52) U.S. Cl.
CPC .. *H01L 21/68721* (2013.01); *H01J 2237/002* (2013.01); *H01J 2237/2007* (2013.01); *H01J 2237/334* (2013.01)

(58) Field of Classification Search
CPC ................. H01J 2237/334; H01J 37/32; H01J 37/32091; H01J 37/32715; H01L 21/6833; H01L 21/68721; H01L 21/67103; H01L 21/67109; H01L 21/683; H01L 21/6831; H01L 21/68735; H01L 21/68757; H01L 21/68785
See application file for complete search history.

(56) References Cited

FOREIGN PATENT DOCUMENTS

| | | | | |
|---|---|---|---|---|
| JP | 5666749 | B1 | 2/2015 | |
| JP | 6805032 | B2 | 12/2020 | |
| KR | 102082732 | B1 * | 2/2020 | ....... H01L 21/67248 |

* cited by examiner

Member 10 for semiconductor manufacturing apparatus

MEMBER FOR SEMICONDUCTOR MANUFACTURING APPARATUS

BACKGROUND OF THE INVENTION

1. Field of the Invention

The present invention relates to a member for a semiconductor manufacturing apparatus.

2. Description of the Related Art

To date, as a member for a semiconductor manufacturing apparatus, for example, that described in Patent Literature 1 is known. The member for a semiconductor manufacturing apparatus is a member in which a holding member having a circular wafer placement table and a ring-shaped focus-ring placement table integrated with each other is bonded to a base substrate. The base substrate has, at its center, a wafer-placement-table support including a circular wafer-placement-table support surface, and has a focus-ring-placement-table support at an outer periphery of the wafer-placement-table support, the focus-ring-placement-table support including a ring-shaped focus-ring-placement-table support surface at a height that is lower than that of the wafer-placement-table support surface. An internal space exists between an outer peripheral surface of the wafer-placement-table support of the base substrate and a surface of the holding member opposing the outer peripheral surface. When the two surfaces are bonded with an adhesive, since a gap between the two surfaces is narrow, peeling of a bonded portion tends to occur. When the bonded portion peels, the heat transference of a peeled portion and the heat transference of an unpeeled portion may differ from each other, as a result of which the uniformity of a temperature distribution is reduced. Therefore, an internal space is caused to exist without bonding the two surfaces with an adhesive.

CITATION LIST

Patent Literature

PTL 1: Japanese Patent No. 6805032

SUMMARY OF THE INVENTION

However, since the holding member has a connection part where the wafer placement table and the focus-ring placement table are connected to each other, the connection part is subjected to stress and is cracked. In addition, since the internal space is a closed space, the internal space cannot be effectively used by being controlled from the outside.

The present invention has been made to solve such a problem, and a primary object of the present invention is to make it possible to suppress occurrence of cracks and to control an internal space from the outside.

A member for a semiconductor manufacturing apparatus of the present invention includes: a conductive base substrate that has a wafer-placement-table support including a circular wafer-placement-table support surface, and that has a focus-ring-placement-table support at an outer periphery of the wafer-placement-table support, the focus-ring-placement-table support including a ring-shaped focus-ring-placement-table support surface at a height that is lower than a height of the wafer-placement-table support surface; an insulating focus-ring placement table that has, at an upper surface thereof, a ring-shaped focus-ring placement surface, and that is joined to the focus-ring-placement-table support surface; an insulating wafer placement table that has, at an upper surface thereof, a circular wafer placement surface, that is separate from the focus-ring placement table, that overlaps an inner peripheral portion of the focus-ring placement surface in plan view, and that is joined to the inner peripheral portion of the focus-ring placement surface and to the wafer-placement-table support surface; a ring-shaped internal space that is surrounded by a lower surface of the wafer placement table, an outer peripheral surface of the wafer-placement-table support of the base substrate, an inner peripheral surface of the focus-ring placement table, and the focus-ring-placement-table support surface of the base substrate; and a communication path that is provided at the base substrate and that causes the internal space and an outside of the base substrate to communicate with each other.

In the member for a semiconductor manufacturing apparatus, the wafer placement table is separate from the focus-ring placement table, overlaps the inner peripheral portion of the focus-ring placement surface in plan view, and is joined to the inner peripheral portion of the focus-ring placement surface and to the wafer-placement-table support surface. Therefore, compared with the case in which a holding member having a wafer placement table and a focus-ring placement table integrated with each other is used as in Patent Literature 1, it is possible to suppress occurrence of cracks. In addition, the ring-shaped internal space is not a closed space, and communicates with the outside of the base substrate through the communication path provided in the base substrate. Therefore, it is possible to control the internal space from the outside through the communication path.

Note that, in the present description, the present invention is described by using, for example, up, down, left, right, front, and back. However, up, down, left, right, front, and back are merely relative positional relationships. Therefore, when the orientation of the member for a semiconductor manufacturing apparatus is changed, up and down may become left and right, or left and right may become up or down, and such cases are also included in the technical scope of the present invention.

In the member for a semiconductor manufacturing apparatus of the present invention, the wafer placement table may close an upper portion of the internal space. This makes it possible to change, for example, the pressure of the internal space through the communication path.

In the member for a semiconductor manufacturing apparatus of the present invention, the wafer placement table may have a through hole extending from the internal space to the wafer placement surface. This makes it possible for gas (for example, heat-transfer gas) introduced into the communication path to be supplied to a lower surface of a wafer that is placed on the wafer placement surface from the through hole via the ring-shaped internal space. Therefore, it is no longer necessary to provide a gas path inside the base substrate.

In the member for a semiconductor manufacturing apparatus of the present invention, the focus-ring placement table may be joined to the focus-ring-placement-table support surface via a first joined layer, the wafer placement table may be joined to the wafer-placement-table support surface via a second joined layer, and the first and second joined layers may each be a metal joined layer. Compared with the case in which the first joined layer and the second joined layer are resin (organic) joined layers, this makes it possible to efficiently transfer the heat of a wafer and the heat of a focus ring to the base substrate. In addition, the electric potential of the first joined layer and the electric potential of the second joined layer can be made the same as the electric potential of the base substrate.

In the member for a semiconductor manufacturing apparatus of the present invention, the focus-ring placement surface and the wafer-placement-table support surface may be at a same height. This makes it possible for the wafer placement table to be relatively easily joined to the inner peripheral portion of the focus-ring placement surface and to the wafer-placement-table support surface. Note that "the same" includes, in addition to cases that are exactly the same, cases that, though not exactly the same, are within a tolerance range (the same shall apply below).

In the member for a semiconductor manufacturing apparatus of the present invention, the base substrate may have a refrigerant flow path therein, and a distance from a ceiling surface of the refrigerant flow path to the wafer-placement-table support surface may be smaller than a distance from the ceiling surface of the refrigerant flow path to the focus-ring-placement-table support surface. This makes it possible to efficiently reduce the temperature of a wafer.

In the member for a semiconductor manufacturing apparatus of the present invention, the base substrate may have a refrigerant flow path therein, and, of the refrigerant flow path, a wafer flow path corresponding to the wafer-placement-table support surface and a focus-ring flow path corresponding to the focus-ring-placement-table support surface may be independently provided, and refrigerants of different systems may each be supplied to a corresponding one of the wafer flow path and the focus-ring flow path. This makes it easier to separately control the temperature of a wafer and the temperature of a focus ring.

In the member for a semiconductor manufacturing apparatus of the present invention, the wafer placement table may have separately built therein a wafer attraction electrode and a bias RF electrode, or may have built therein a multi-purpose electrode serving as the wafer attraction electrode and the bias RF electrode. The focus-ring placement table may have separately built therein a focus-ring attraction electrode and a focus-ring RF bias electrode, or may have built therein a multi-purpose electrode serving as the focus-ring attraction electrode and the focus-ring RF bias electrode. The base substrate may serve as a source RF electrode.

In the member for a semiconductor manufacturing apparatus of the present invention, the wafer placement table and the focus-ring placement table may not have an electrode built therein, and the base substrate may serve as a wafer attraction electrode, a focus-ring attraction electrode, a bias RF electrode, and a source RF electrode. This makes it possible to reduce the thickness of the wafer placement table and the thickness of the focus-ring placement table.

DETAILED DESCRIPTION OF THE INVENTION

Figure 1:
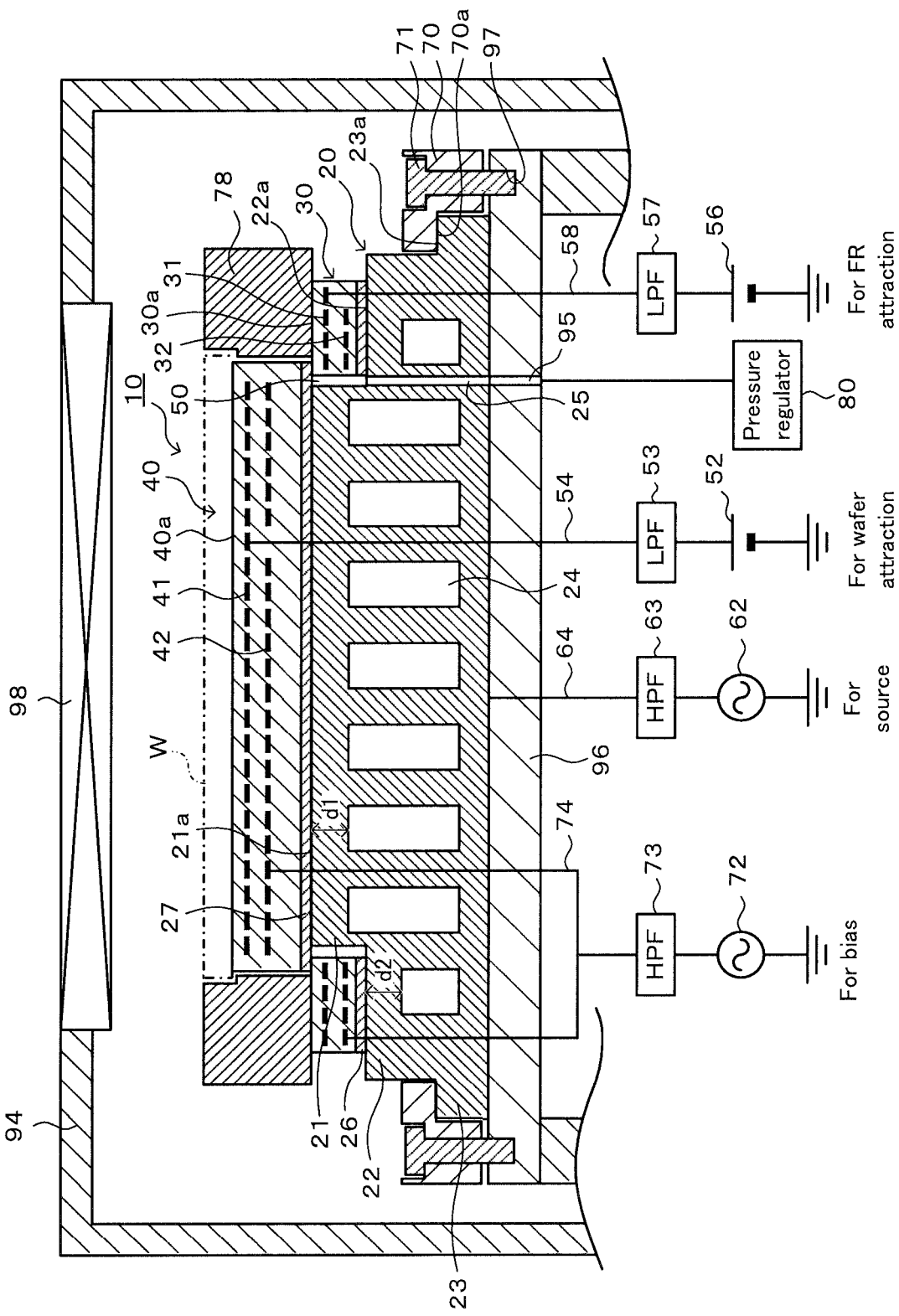
FIG. 1 is a vertical cross-sectional view of a member 10 for a semiconductor manufacturing apparatus.
Figure 2:
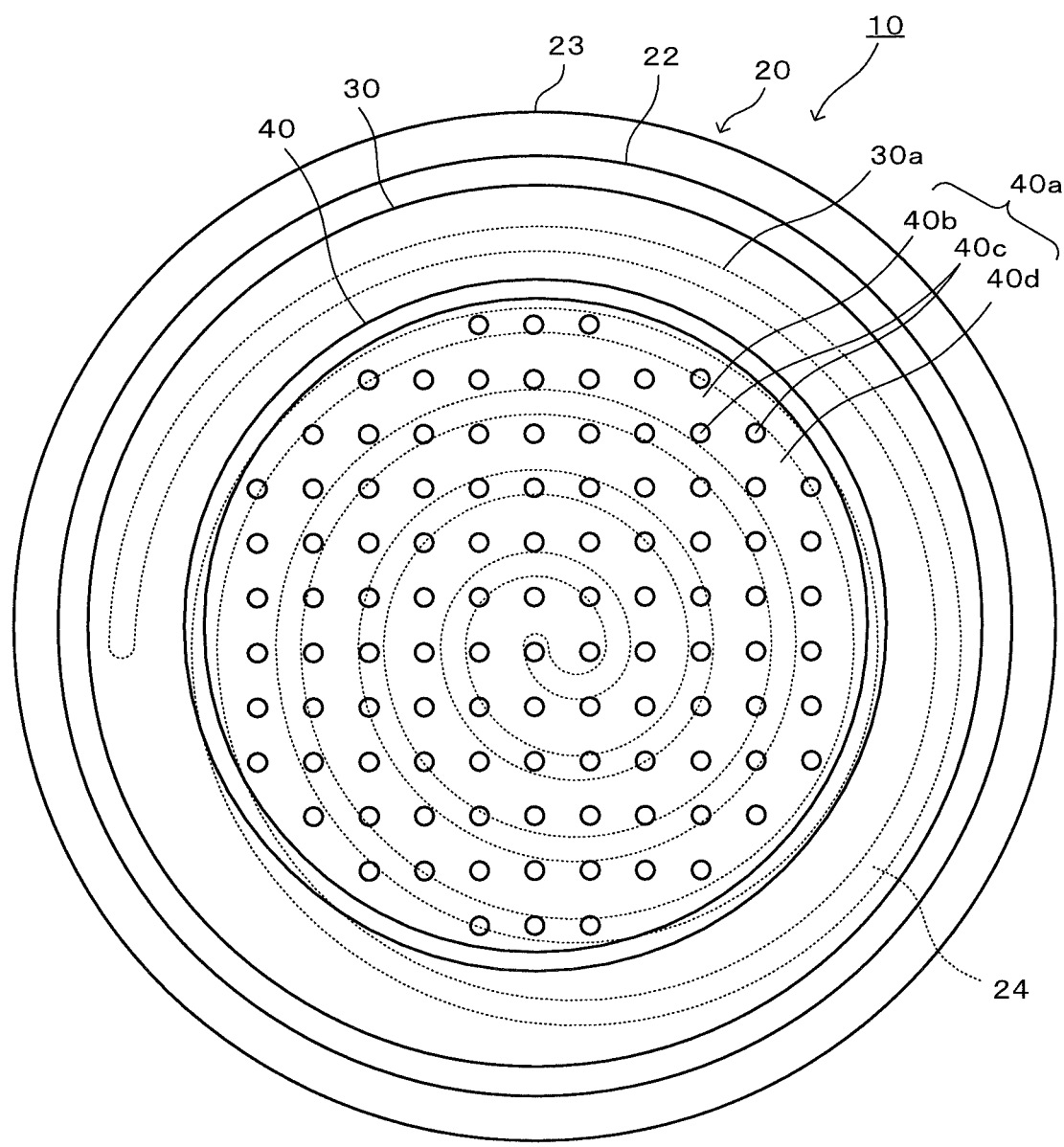
FIG. 2 is a plan view of the member 10 for a semiconductor manufacturing apparatus.
Figure 3:
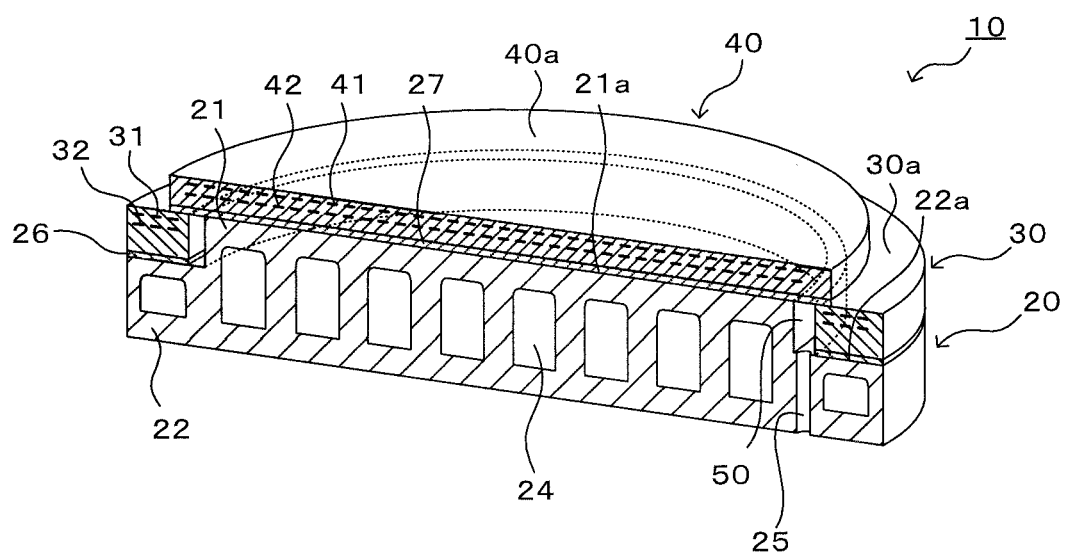
FIG. 3 is a partial-cross-sectional perspective view of the member 10 for a semiconductor manufacturing apparatus.

Preferred embodiments of the present invention are described below with reference to the drawings. FIG. 1 is a vertical cross-sectional view of a member 10 for a semiconductor manufacturing apparatus (cross-sectional view when the member 10 for a semiconductor manufacturing apparatus is cut by a plane including a central axis of the member 10 for a semiconductor manufacturing apparatus), FIG. 2 is a plan view of the member 10 for a semiconductor manufacturing apparatus (however, a focus ring 78 is omitted), and FIG. 3 is a partial-cross-sectional perspective view of the member 10 for a semiconductor manufacturing apparatus (however, a flange portion 23 is omitted). In the present description, " . . . to . . . " indicating a numerical range is used to mean that numeral values before and after the "to" are included as a lower limit and an upper limit.

The member 10 for a semiconductor manufacturing apparatus is used for performing, for example, CVD or etching on a wafer W by using plasma, and is fixed to an insulating installation plate 96 provided inside a chamber 94 for a semiconductor process. The member 10 for a semiconductor manufacturing apparatus includes a base substrate 20, a focus-ring placement table 30, a wafer placement table 40, an internal space 50, and a communication path 25. A focus ring may be abbreviated as "FR" below.

The base substrate 20 is a conductive disc member. The base substrate 20 has a wafer-placement-table support 21, an FR-placement-table support 22, and a flange portion 23. The wafer-placement-table support 21 is provided at the center of the base substrate 20, and includes a circular wafer-placement-table support surface 21a. The FR-placement-table support 22 is provided at an outer periphery of the wafer-placement-table support 21, and includes a ring-shaped FR-placement-table support surface 22a at a height that is lower than that of the wafer-placement-table support surface 21a. The flange portion 23 is provided at an outer periphery of the FR-placement-table support 22, and includes a ring-shaped flange surface 23a at a height that is lower than that of the FR-placement-table support surface 22a. The base substrate 20 has a refrigerant flow path 24 in which a refrigerant can circulate. The refrigerant flow path 24 is provided in a one-stroke pattern over the entire base substrate 20 in plan view (FIG. 2). A distance d1 between the wafer-placement-table support surface 21a and a ceiling surface of the refrigerant flow path 24 in the base substrate 20 is the same as a distance d2 between the FR-placement-table support surface 22a and the ceiling surface of the refrigerant flow path 24 in the base substrate 20. The distances d1 and d2 are preferably 5 mm or less, and more preferably 3 mm or less. An upper corner of the refrigerant flow path 24 (corner where a side wall and the ceiling surface intersect) preferably has a curved surface, and the radius of curvature of the curved surface is preferably, for example, 0.5 mm to 2 mm. A refrigerant that flows in the refrigerant flow path 24 is preferably a liquid, and preferably has an electrically insulating property. The electrically insulating liquid is, for example, a fluorinated inert liquid.

The base substrate 20 can be made of a conductive material containing a metal. The conductive material is, for example, a composite material or a metal. The composite material is, for example, a metal matrix composite (MMC), and the MMC is, for example, a material containing Si, SiC, and Ti, or a material in which a SiC porous body is impregnated with Al and/or Si. The material containing Si, SiC, and Ti is called SiSiCTi, the material in which the SiC porous body is impregnated with Al is called AlSiC, and the material in which the SiC porous body is impregnated with Si is called SiSiC. When the FR placement table 30 and the wafer placement table 40 are made of alumina, the MMC that is used in the base substrate 20 is preferably, for example, AlSiC or SiSiCTi whose coefficient of thermal expansion (CTE) is close to that of alumina. The metal is, for example, Ti, Mo, Al, or an alloy thereof.

The base substrate 20 serves as a source RF electrode, and is connected to a source RF power source 62 through a feeder member 64. In the feeder member 64, a high-pass filter (HPF) 63 is disposed between the base substrate 20 and the source RF power source 62. The source RF power source 62 generates a source RF for generating plasma.

The FR placement table 30 is an insulating ring-shaped member and has, at its upper surface, a FR placement surface 30a. The FR placement table 30 is joined to the FR-placement-table support surface 22a of the base substrate 20 through a ring-shaped joined layer (first joined layer) 26. The FR placement surface 30a is disposed at a height that is the same as that of the wafer-placement-table support surface 21a of the base substrate 20. The focus ring 78 is placed on the FR placement surface 30a. In order from a side close to the FR placement surface 30a, a FR attraction electrode 31 and a bias RF electrode 32 are built in the FR placement table 30. The electrodes 31 and 32 are each made of, a material containing, for example, W, Mo, WC, or MoC. The FR attraction electrode 31 is a plate-shaped or mesh single-pole electrostatic electrode. In the FR placement table 30, a layer disposed above the FR attraction electrode 31 functions as a dielectric layer. A FR attraction power source 56 is connected to the FR attraction electrode 31 through a feeder member 58. The feeder member 58 is electrically insulated from the base substrate 20, the ring-shaped joined layer 26, and the bias RF electrode 32. A low-pass filter (LPF) 57 is provided between the FR attraction power source 56 and the FR attraction electrode 31 in the feeder member 58.

The wafer placement table 40 is an insulating disc member, and has, at its upper surface, a circular wafer placement surface 40a. A wafer W is placed on the wafer placement surface 40a. The wafer placement table 40 is separate from the FR placement table 30, has a diameter that is larger than the diameter of the wafer-placement-table support surface 21a of the base substrate 20, and overlaps an inner peripheral portion of the FR placement surface 30a in plan view.

The wafer placement table 40 is joined to the entire wafer-placement-table support surface 21a and the inner peripheral portion of the FR placement surface 30a by a circular joined layer 27. In the circular joined layer 27, the width (length in a radial direction of the circular joined layer 27) of a portion (overlapping portion) where the FR placement table 30 and the wafer placement table 40 overlap and are joined to each other is preferably at least 3 mm. If the width is at least 3 mm, the sealability of the overlapping portion of the circular joined layer 27 can be sufficiently ensured. In order from a side close to the wafer placement surface 40a, a wafer attraction electrode 41 and a bias RF electrode 42 are built in the wafer placement table 40. The electrodes 41 and 42 are each made of, a material containing, for example, W, Mo, WC, or MoC. The wafer attraction electrode 41 is a plate-shaped or mesh single-pole electrostatic electrode. In the wafer placement table 40, a layer disposed above the wafer attraction electrode 41 functions as a dielectric layer. A wafer attraction power source 52 is connected to the wafer attraction electrode 41 through a feeder member 54. The feeder member 54 is electrically insulated from the base substrate 20, the circular joined layer 27, and the bias RF electrode 42. A LPF 53 is provided between the wafer attraction power source 52 and the wafer attraction electrode 41 in the feeder member 54.

The bias RF electrodes 32 and 42 are connected to a bias RF power source 72 through a feeder member 74. The feeder member 74 is electrically insulated from the ring-shaped joined layer 26, the circular joined layer (second joined layer) 27, and the base substrate 20. A HPF 73 is disposed between the bias RF power source 72 and the bias RF electrodes 32 and 42. The bias RF power source 72 generates a bias RF for bringing ions into the wafer W and the focus ring 78. The bias RF has a frequency that is lower than that of the source RF and has an amplitude that is larger than that of the source RF. The frequency of the source RF is, for example, a few tens of MHz to a few hundred MHz, and the frequency of the bias RF is, for example, a few hundred kHz.

As shown in FIG. 2, the wafer placement surface 40a is provided with a seal band 40b along an outer edge of the wafer placement surface 40a, and a plurality of small protrusions 40c on an inner side of the seal band 40b. The seal band 40b and the plurality of small protrusions 40c are formed at a reference surface 40d of the wafer placement surface 40a. In the present embodiment, the small protrusions 40c are flat columnar protrusions. A top surface of the seal band 40b and a top surface of each of the plurality of small protrusions 40c are positioned in the same plane. The height of the seal band 40b and the height of each small protrusion 40c (that is, the distance from the reference surface 40d to each top surface) is a few μm to a few tens of μm. The wafer W is placed on the wafer placement surface 40a with the wafer W in contact with the top surface of the seal band 40b and the top surface of each of the plurality of small protrusions 40c.

The FR placement table 30 and the wafer placement table 40 can be made of a ceramic material. The ceramic material is, for example, alumina or aluminum nitride. The ring-shaped joined layer 26 and the circular joined layer 27 may be a layer made of, for example, solder or a metal brazing material. The joined layers 26 and 27 are formed by, for example, TCB (thermal compression bonding). TCB refers to a publicly known method in which a metal joining material is interposed between two members to be joined and the two members are pressed and joined to each other while being heated to a temperature less than or equal to the solidus temperature of the metal joining material.

An internal space 50 is a ring-shaped space surrounded by a lower surface (including the circular joined layer 27) of the wafer placement table 40, an outer peripheral surface of the wafer-placement-table support 21 of the base substrate 20, an inner peripheral surface of the FR placement table 30, and the FR-placement-table support surface 22a of the base substrate 20. An upper side of the internal space 50 is closed by the wafer placement table 40 and the circular joined layer 27. The width (length in a radial direction of the FR placement table 30) of the internal space 50 is preferably 0.1 mm or greater.

The communication path 25 is a path that is provided in the base substrate 20 and that extends from a lower surface of the base substrate 20 to the internal space 50. The communication path 25 causes the internal space 50 and the outside of the base substrate 20 to communicate with each other. Here, one communication path 25 is exemplified. The communication path 25 is connected to an external pressure regulator 80 via a through hole 95 extending through the installation plate 96 in an up-down direction. The pressure regulator 80 is capable of setting the internal space 50 to have a vacuum atmosphere or returning the pressure of the internal space 50 to atmospheric pressure.

By using a clamp member 70, the member 10 for a semiconductor manufacturing apparatus is attached to the installation plate 96 provided inside the chamber 94. The clamp member 70 is a ring-shaped member whose cross section has a substantially inverted L shape, and has an inner-periphery stepped surface 70a. The member 10 for a semiconductor manufacturing apparatus and the installation plate 96 are integrated with each other by the clamp member 70. With the inner-periphery stepped surface 70a of the clamp member 70 being placed on the flange surface 23a of the base substrate 20 of the member 10 for a semiconductor manufacturing apparatus, bolts 71 are inserted from an upper side of the clamp member 70 and are screwed into threaded holes 97 provided in an upper side of the installation plate 96. The bolts 71 are attached to a plurality of locations (for example, eight locations or twelve locations) provided at equal intervals along a circumferential direction of the clamp member 70. The clamp member 70 and the bolts 71 may be made of an insulating material or a conductive material (such as a metal). A seal member (not shown) may be disposed between the lower surface of the base substrate 20 and an upper surface of the installation plate 96. The seal member may be, for example, an O ring that surrounds each of the feeder members 54, 58, 64, and 74, an O ring that maintains airtightness between the communication path 25 and the through hole 95, or an O ring having substantially the same diameter as the diameter of the base substrate 20. Such a seal member exhibits sealability as a result of being flattened in an up-down direction by screwing the bolts 71 into the threaded holes 97. The seal member may be made of a metal or a resin.

Figure 4A:
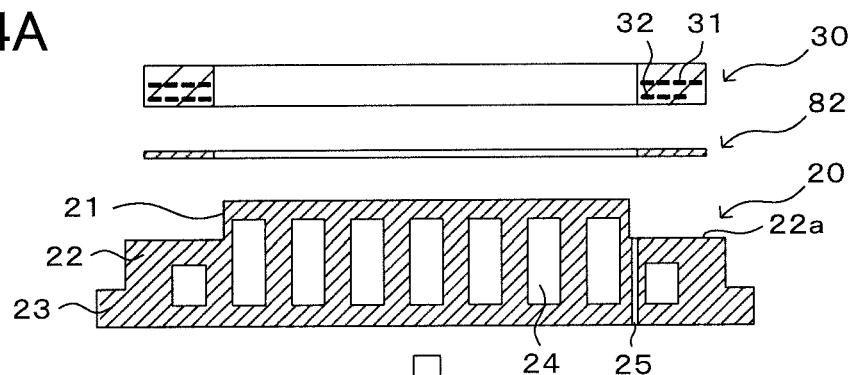
FIGS. 4A to 4D illustrate the steps of manufacturing the member 10 for a semiconductor manufacturing apparatus.

Next, an example of manufacturing the member 10 for a semiconductor manufacturing apparatus is described with reference to FIGS. 4A to 4D. FIGS. 4A to 4D illustrate the steps of manufacturing the member 10 for a semiconductor manufacturing apparatus. Note that a structure for attaching the feeder members 54, 58, and 74 is not shown. First, a base substrate 20, a FR placement table 30, and a ring-shaped metal joining material 82 are prepared (FIG. 4A). The base substrate 20 is formed, for example, in the following way. First, in conformity with Japanese Patent No. 5666748 and Japanese Patent No. 5666749, a circular cooling plate having a refrigerant flow path therein and being made of MMC is prepared. By subjecting the circular cooling plate to external shape processing, the base substrate 20 including a wafer-placement-table support 21, a FR-placement-table support 22, and a flange portion 23 and having a refrigerant flow path 24 therein is obtained. A communication path 25 is provided in the base substrate 20. The FR placement table 30 is formed, for example, in the following way. First, three disc molded bodies containing ceramic powder are formed. Next, a printing electrode having a shape that is the same as the shape of a bias RF electrode is printed along an outer periphery of an upper surface of the first disc molded body, and a printing electrode having a shape that is the same as the shape of a FR attraction electrode is printed along an outer periphery of an upper surface of the second disc molded body. Then, the second disc molded body is stacked on a printing electrode surface of the first circular molded body with a printing-electrode surface of the second disc molded body at the top, and further the third disc molded body is stacked thereon, to form a stacked body. The stacked body is subjected to hot-press firing, and the obtained fired body is subjected to external shape processing, to obtain the ring-shaped FR placement table 30. The printing electrodes become a corresponding one of a FR attraction electrode 31 and a bias RF electrode 32. The FR placement table 30 at this stage is such that the distance from the FR attraction electrode 31 to an upper surface of the FR placement table 30 is larger than that of the final FR placement table 30. The metal joining material 82 finally becomes a ring-shaped joined layer 26.

Figure 4B:
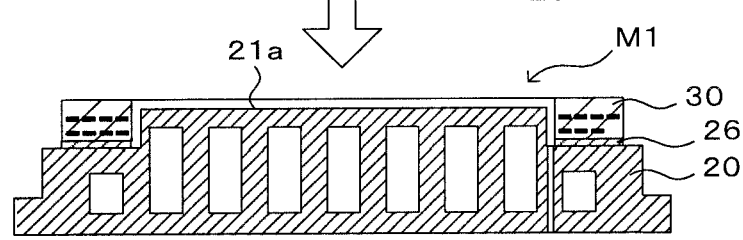

Next, the ring-shaped metal joining material 82 is stacked on a FR-placement-table support surface 22a of the base substrate 20, and the ring-shaped FR placement table 30 is stacked thereon, to obtain a stacked body. By pressing the upper surface of the FR placement table 30 while heating the stacked body (TCB), a joined body M1 is obtained (FIG. 4B). The TCB is performed, for example, in the following way. The stacked body is pressed and joined at a temperature that is less than or equal to the solidus temperature of the metal joining material 82 (for example, greater than or equal to a temperature obtained by subtracting 20° C. from the solidus temperature and less than or equal to the solidus temperature), and then the temperature is returned to room temperature. Therefore, the metal joining material 82 becomes the ring-shaped joined layer 26. As the metal joining material 82 at this time, an Al—Mg based joining material or an Al—Si—Mg based joining material can be used. For example, when the TCB is performed by using the Al—Si—Mg based joining material, the stacked body is pressed while being heated in a vacuum atmosphere. The thickness of the metal joining material 82 to be used is preferably about 100 μm.

Figure 4C:
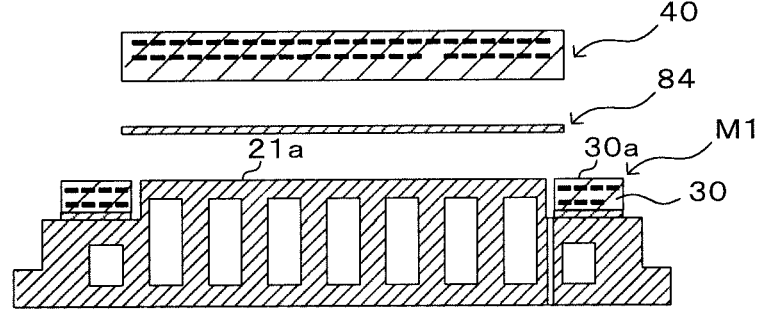
Figure 4D:
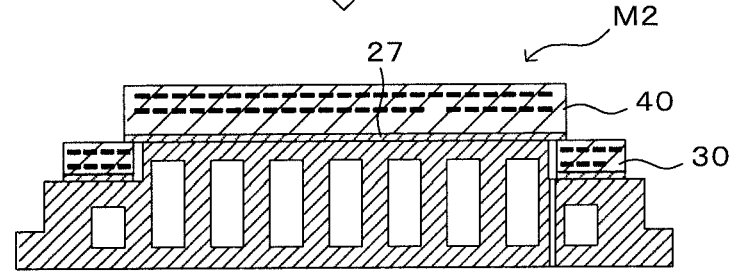

Next, a wafer placement table 40 and a circular metal joining material 84 are prepared, and the FR placement table 30 of the joined body M1 is subjected to grinding to cause the upper surface of the FR placement table 30 to be at a height that is the same as that of a wafer-placement-table support surface 21a (FIG. 4C). The wafer placement table 40 can be formed in the same way as the FR placement table 30 except that the shapes of printing electrodes and the external shape processing differ. The metal joining material 84 finally becomes a circular joined layer 27. Next, the circular metal joining material 84 is stacked on the entire surface of the wafer-placement-table support surface 21a and an inner peripheral portion of a FR placement surface 30a, and the circular wafer placement table 40 is stacked thereon, to obtain a stacked body. By pressing an upper surface of the wafer placement table 40 while heating the stacked body (TCB), a joined body M2 is obtained (FIG. 4D). This causes the metal joining material 84 to become the circular joined layer 27. Then, after subjecting the upper surface of the wafer placement table 40 to a mirror finish, a seal band 40b and a plurality of small protrusions 40c (FIG. 2) are formed at this surface by, for example, blasting, to obtain the member 10 for a semiconductor manufacturing apparatus.

During the manufacturing process, a lift pin hole may be provided in the base substrate 20 and the wafer placement table 40. The lift pin hole is a hole for inserting a lift pin that moves a wafer W up and down with respect to the wafer placement surface 40a. It is preferable that a wall surface of the lift pin hole be protected so as to be electrically insulated from conductors (the base substrate 20 and the joined layers 26 and 27).

Next, an example of use of the member 10 for a semiconductor manufacturing apparatus is described by using FIG. 1. As described above, the member 10 for a semiconductor manufacturing apparatus is placed on the installation plate 96 in the chamber 94. A shower head 98 that discharges process gas from a plurality of gas injection holes into the chamber 94 is disposed at a ceiling surface of the chamber 94.

The focus ring 78 is placed on the FR placement surface 30a of the member 10 for a semiconductor manufacturing apparatus, and the wafer W is placed on the wafer placement surface 40a. The focus ring 78 includes a step along an inner periphery of an upper end portion thereof so as not to interfere with the wafer W. In this state, a direct-current voltage of the wafer attraction power source 52 is applied to the wafer attraction electrode 41 to attract the wafer W to the wafer placement surface 40a. In conjunction with this, a direct-current voltage of the FR attraction power source 56 is applied to the FR attraction electrode 31 to attract the focus ring 78 to the FR placement surface 30a. The pressure regulator 80 operates to set the ring-shaped internal space 50 to have a vacuum atmosphere. Therefore, since the internal space 50 functions as a thermal resistance layer, it becomes easier to independently control the temperature of the wafer W and the temperature of the focus ring 78. Then, the inside of the chamber 94 is set to have a predetermined vacuum atmosphere (or a reduced-pressure atmosphere), and a source RF voltage is applied from the source RF power source 62 to the base substrate 20 while supplying process gas from the shower head 98. In conjunction with this, a bias RF voltage is applied from the bias RF power source 72 to the bias RF electrodes 32 and 42. This causes plasma to be generated between the shower head 98 and the joined layers 26 and 27 whose electrical potential is the same as that of the base substrate 20 to which the source RF voltage has been applied. Then, the plasma is used to subject the wafer W to chemical vapor deposition (CVD) or etching. The source RF voltage is applied for generating plasma, and the bias RF voltage is applied for bringing ions into the wafer W and the focus ring 78.

Note that, although the focus ring 78 also wears as the wafer W is subjected to plasma processing, since the focus ring 78 is thicker than the wafer W, the focus ring 78 is replaced after processing a plurality of wafers W.

In the member 10 for a semiconductor manufacturing apparatus described above, the wafer placement table 40 is separate from the FR placement table 30, and is joined to the inner peripheral portion of the FR placement surface 30a and to the wafer-placement-table support surface 21a. Therefore, compared with the case in which a holding member having a wafer placement table and a focus-ring placement table integrated with each other is used as in Patent Literature 1, it is possible to suppress occurrence of cracks. That is, although cracks tend to occur at a connection portion between the wafer placement table and the FR placement table in the integrated holding member, occurrence of cracks can be suppressed because such a connection portion does not exist in the embodiment described above. In addition, the ring-shaped internal space is not a closed space, and communicates with the outside of the base substrate through the communication path provided in the base substrate. Therefore, it is possible to control the internal space from the outside through the communication path.

The wafer placement table 40 closes, together with the circular joined layer 27, an upper portion of the internal space 50. Therefore, it is possible to cause the pressure of the internal space 50 to become a vacuum pressure or atmospheric pressure through the communication path 25.

Further, since the ring-shaped joined layer 26 and the circular joined layer 27 are each a metal joined layer, compared with when the joined layers 26 and 27 are resin (organic) joined layers, it is possible to cause the heat of the wafer W and the heat of the focus ring 78 to efficiently escape to the base substrate 20. In addition, the electric potentials of the joined layers 26 and 27 can be made the same as the electric potential of the base substrate 20.

Still further, the FR placement surface 30a and the wafer-placement-table support surface 21a are disposed at the same height. Therefore, the wafer placement table 40 can be relatively easily joined to the inner peripheral portion of the FR placement surface 30a and the wafer-placement-table support surface 21a.

The wafer placement table 40 has separately built therein the wafer attraction electrode 41 and the bias RF electrode 42, and the FR placement table 30 has separately built therein the FR attraction electrode 31 and the bias RF electrode 32. The efficiency of bringing ions into the wafer W is increased by disposing the bias RF electrode 32 close to a surface of the placement table 30 and the bias RF electrode 42 close to a surface of the placement table 40. From the viewpoint of reducing variations in the density of plasma, the size of the source RF electrode needs to be one that allows an area thereof to be larger than the diameter of a wafer surface on the wafer placement table 40, as a result of which the base substrate 20 that cools the wafer placement table 40 and the FR placement table 30 also serves as the source RF electrode.

The present invention is not limited to the above-described embodiment, and can be carried out by various modes as long as they belong to the technical scope of the invention.

In the embodiment above, although an example in which the pressure of the internal space 50 is caused to become a vacuum pressure or atmospheric pressure through the communication path 25 is given, the present invention is not limited thereto. For example, the type of gas that is sealed in the internal space 50 through the communication path 25 may be changed.

Figure 5:
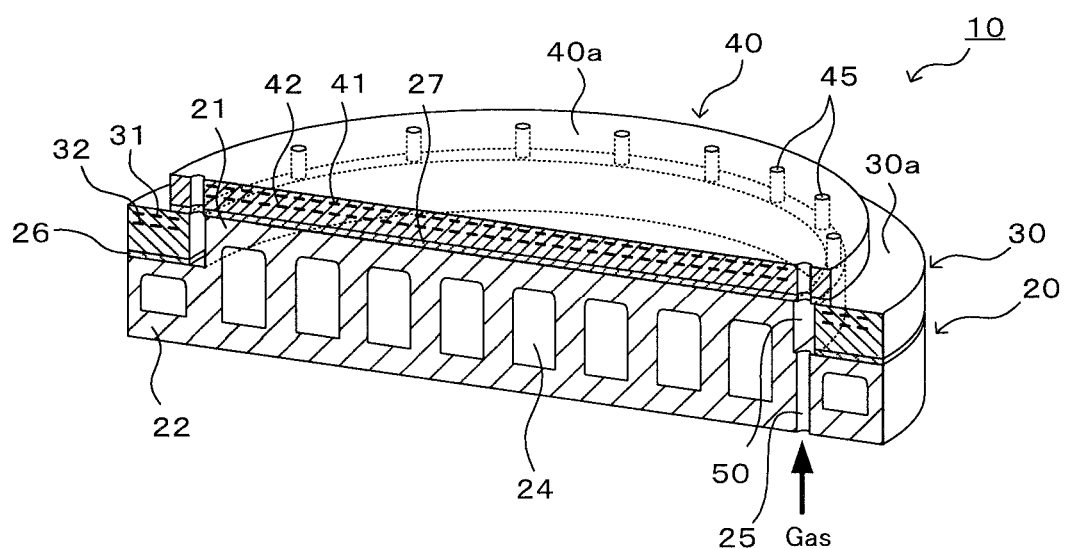
FIG. 5 is a partial-cross-sectional perspective view of a different example of a member 10 for a semiconductor manufacturing apparatus.

In the embodiment above, although the wafer placement table 40 closes, together with the circular joined layer 27, the upper portion of the internal space 50, the present invention is not limited thereto. For example, as shown in FIG. 5, the wafer placement table 40 (including the circular joined layer 27) may have a plurality of through holes 45 extending from the internal space 50 to the wafer placement surface 40a. In FIG. 5, structural elements that are the same as those of the embodiment above are given the same reference numerals. This makes it possible to use the internal space 50 as a gas path. That is, gas (for example, heat-transfer gas such as He) introduced into the communication path 25 from the outside can be supplied to a lower surface of the wafer W that is placed on the wafer placement surface 40a (space surrounded by the seal band 40b, the small protrusions 40c, the reference surface 40d, and the wafer W) from the plurality of through holes 45 via the ring-shaped internal space 50. In general, when gas is supplied to the lower surface of the wafer W, a ring-shaped path that is concentric with the base substrate 20 is formed inside the base substrate 20, a communication path that is connected to the ring-shaped path from the lower surface of the base substrate 20 is provided, and a plurality of gas holes extending through the base substrate 20, the circular joined layer 27, and the wafer placement table 40 from the ring-shaped path are provided. When the structure in FIG. 5 is used, it is no longer necessary to form a ring-shaped path inside the base substrate 20, and to form holes extending from the ring-shaped path to an upper surface of the base substrate 20.

In the embodiment above, although the distance d1 from the ceiling surface of the refrigerant flow path 24 to the wafer-placement-table support surface 21a is the same as the distance d2 from the ceiling surface of the refrigerant flow path 24 to the FR-placement-table support surface 22a, the present invention is not particularly limited thereto. For example, the distance d1 may be smaller than the distance d2. This makes it possible to efficiently reduce the temperature of the wafer W.

Figure 6:
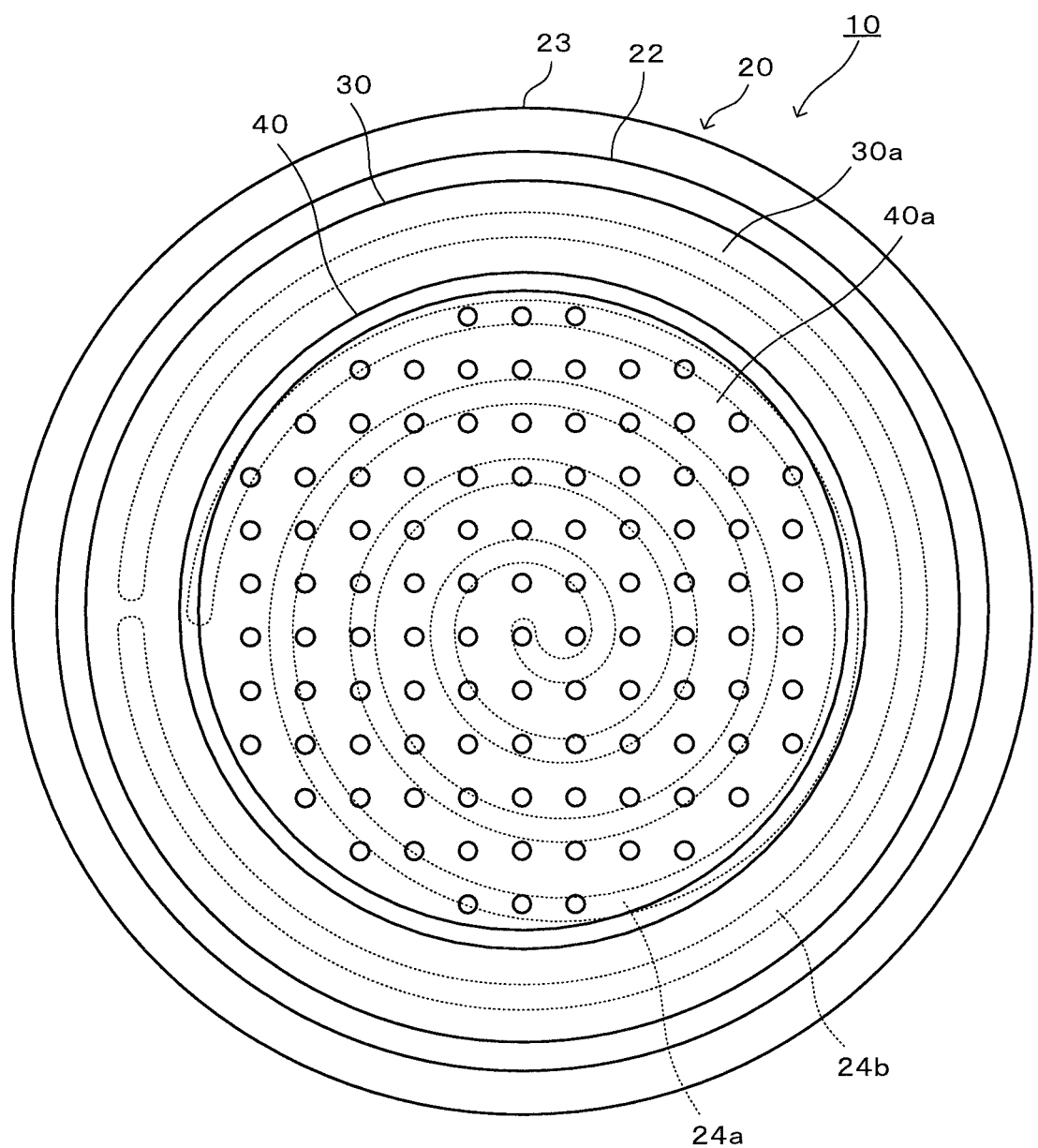
FIG. 6 is a plan view of a different example of a member 10 for a semiconductor manufacturing apparatus.
Figure 7:
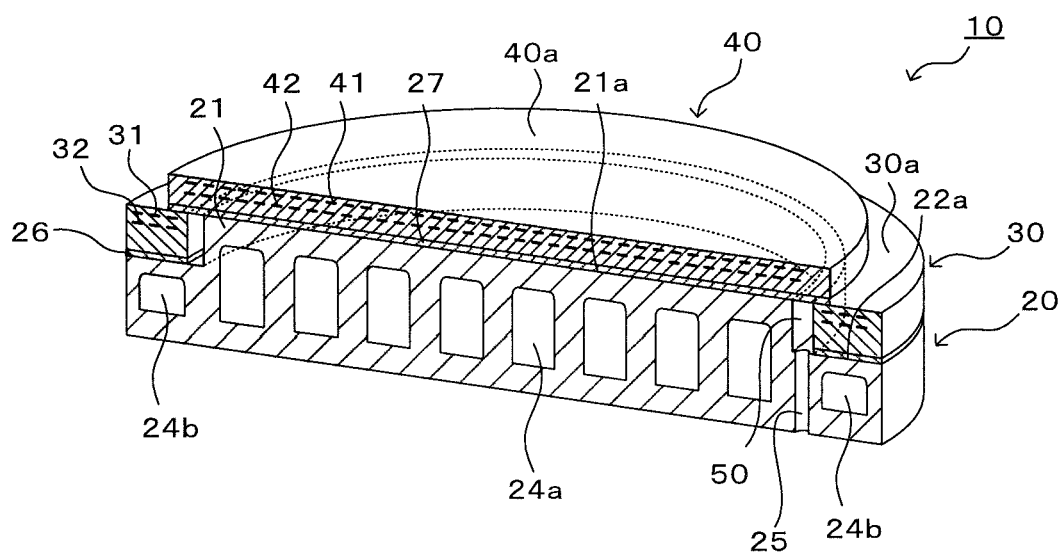
FIG. 7 is a partial-cross-sectional perspective view of FIG. 6.

In the embodiment above, although an example in which the refrigerant flow path 24 is spirally formed in a one-stroke pattern over the entire wafer-placement-table support surface 21a and the entire FR-placement-table support surface 22a of the base substrate 20 in plan view is given, the present invention is not limited thereto. For example, as shown in FIG. 6 and FIG. 7, a wafer refrigerant flow path 24a and a FR refrigerant flow path 24b may be independently provided and refrigerants of different systems may each be supplied to a corresponding one of the flow paths. In FIG. 6 and FIG. 7, structural elements that are the same those of the embodiments above are given the same reference numerals. The wafer refrigerant flow path 24a is formed in a one-stroke pattern over the entire wafer-placement-table support surface 21a in plan view, and the FR refrigerant flow path 24b is formed in a one-stroke pattern over the entire FR-placement-table support surface 22a in plan view. This makes it easier to separately control the temperature of the wafer W and the temperature of the focus ring 78.

Figure 8:
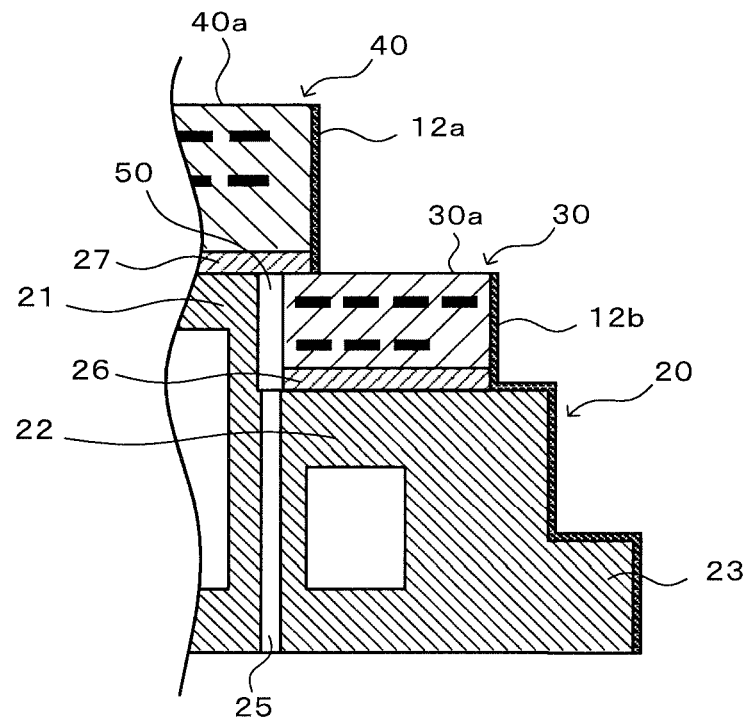
FIG. 8 is a partial vertical cross-sectional view of a member for a semiconductor manufacturing apparatus including insulating films 12a and 12b.
Figure 9:
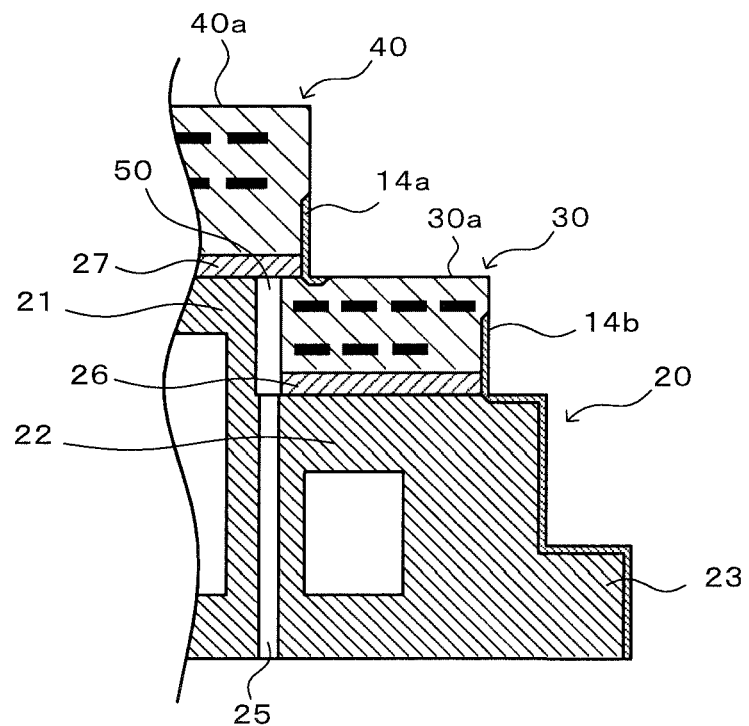
FIG. 9 is a partial vertical cross-sectional view of a member for a semiconductor manufacturing apparatus including insulating films 14a and 14b.

In the embodiment above, as shown in FIG. 8, an outer peripheral surface of the wafer placement table 40, an outer peripheral surface of the circular joined layer 27, an outer peripheral surface of the FR placement table 30, an outer peripheral surface of the ring-shaped joined layer 26, and a surface of the base substrate 20 exposed to the outside are preferably covered by a corresponding one of an insulating film 12a and an insulating film 12b. In FIG. 8, structural elements that are the same those of the embodiments above are given the same reference numerals. This makes it possible to prevent the outer peripheral surfaces of the joined layers 26 and 27 and the surface of the base substrate 20 exposed to the outside from being corroded. Of the insulating film 12a, a portion that covers the outer peripheral surface of the wafer placement table 40 may be omitted, or, of the insulating film 12b, a portion that covers the outer peripheral surface of the FR placement table 30 may be omitted. Alternatively, as shown in FIG. 9, the outer peripheral surface of the circular joined layer 27 and a surrounding region thereof (a part of the outer peripheral surface of the wafer placement table 40 and a part of the FR placement surface 30a of the FR placement table 30) and the outer peripheral surface of the ring-shaped joined layer 26 and a surrounding region thereof (a part of the outer peripheral surface of the FR placement table 30) may be provided with insulating-film formation grooves, and the grooves may be filled with a corresponding one of an insulation film 14a and an insulation film 14b. In FIG. 9, structural elements that are the same those of the embodiments above are given the same reference numerals. After forming the insulating films 14a and 14b, a surface of the insulating film 14a is subjected to shape processing to become flush with the outer peripheral surface of the wafer placement table 40 and the FR placement surface 30a of the FR placement table 30, and a surface of the insulating film 14b is subjected to shape processing to become flush with the outer peripheral surface of the FR placement table 30. Even this makes it possible to prevent the outer peripheral surfaces of the joined layers 26 and 27 and the surface of the base substrate exposed to the outside from being corroded. The insulating films 12a, 12b, 14a, and 14b are, for example, sprayed layers, such as alumina or yttria.

Figure 10:
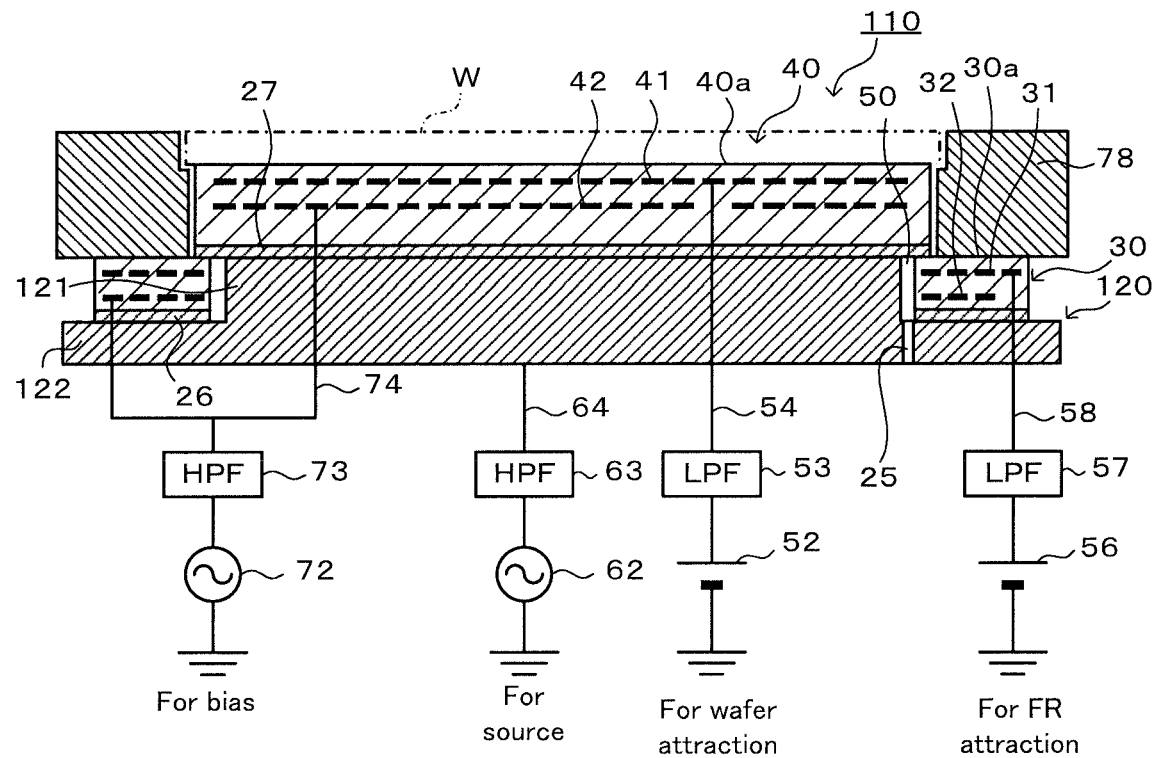
FIG. 10 is a vertical cross-sectional view of a member 110 for a semiconductor manufacturing apparatus.

In the embodiment above, although the base substrate 20 having a refrigerant flow path 24 therein is used, a base substrate 120 that does not have a refrigerant flow path therein as in a member 110 for a semiconductor manufacturing apparatus shown in FIG. 10 may be used. In FIG. 10, structural elements that are the same those of the embodiments above are given the same reference numerals. Note that the base substrate 120 has a wafer-placement-table support 121 and a FR-placement-table support 122. Although the base substrate 120 does not have a clamp flange portion, it may have a flange portion.

Figure 11:
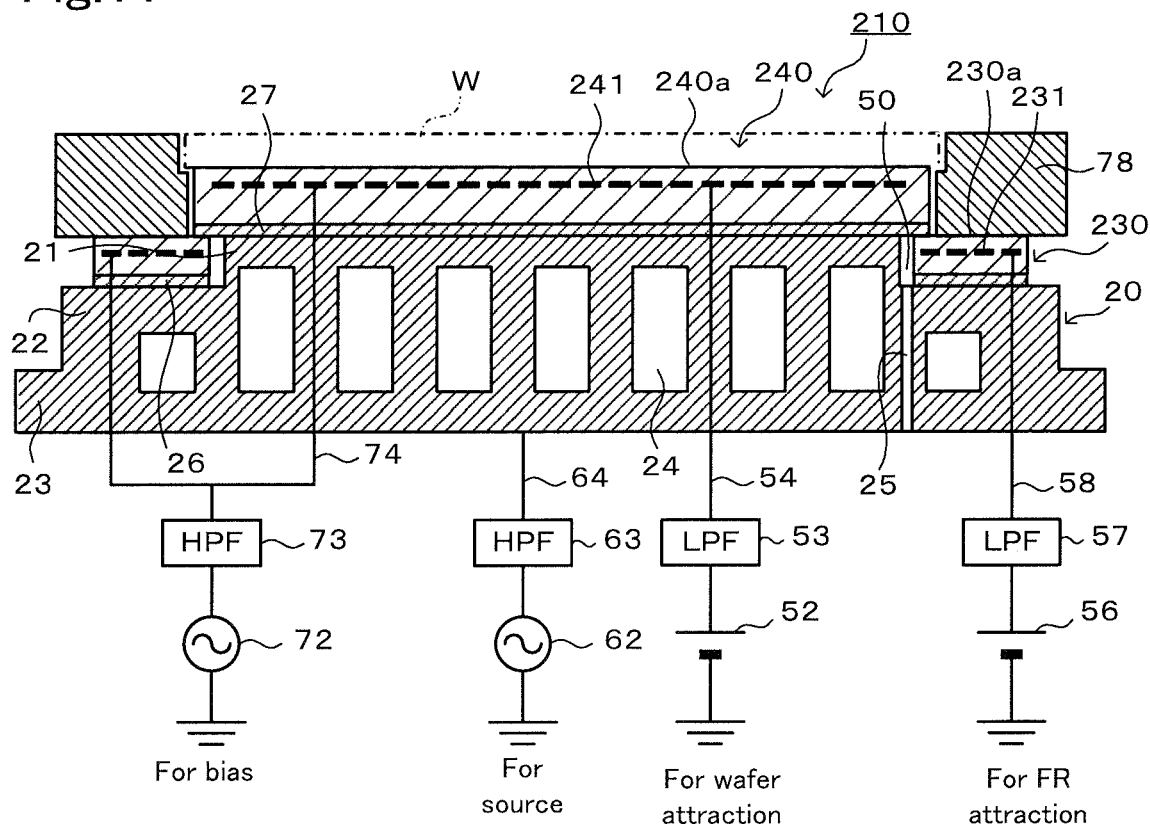
FIG. 11 is a vertical cross-sectional view of a member 210 for a semiconductor manufacturing apparatus.

In the embodiment above, although the wafer placement table 40 has separately built therein the wafer attraction electrode 41 and the bias RF electrode 42, and the FR placement table 30 has separately built therein the FR attraction electrode 31 and the bias RF electrode 32, the present invention is not limited thereto. For example, as in a member 210 for a semiconductor manufacturing apparatus shown in FIG. 11, a wafer placement table 240 may have built therein a multi-purpose electrode 241, and a FR placement table 230 may have built therein a multi-purpose electrode 231. In FIG. 11, structural elements that are the same those of the embodiments above are given the same reference numerals. A direct-current voltage of a wafer attraction power source 52 and an RF voltage of a bias RF power source 72 are applied to the multi-purpose electrode 241 of the wafer placement table 240. A direct-current voltage of a FR attraction power source 56 and the RF voltage of the bias RF power source 72 are applied to the multi-purpose electrode 231 of the FR placement table 230. This makes it possible to cause the distance between a wafer placement surface 240a and the multi-purpose electrode 241 to which the bias RF voltage is applied to be smaller than that in the embodiments above, as a result of which reactance therebetween is reduced and ions can be efficiently brought into the wafer W. This also makes it possible to cause the distance between a FR placement surface 230a and the multi-purpose electrode 231 to which the bias RF voltage is applied to be smaller than that in the embodiments above, as a result of which reactance therebetween is reduced and ions can be efficiently brought into the focus ring 78. Note that, in FIG. 11, instead of the base substrate 20, the base substrate 120 in FIG. 10 that does not have a refrigerant flow path therein may be used.

Figure 12:
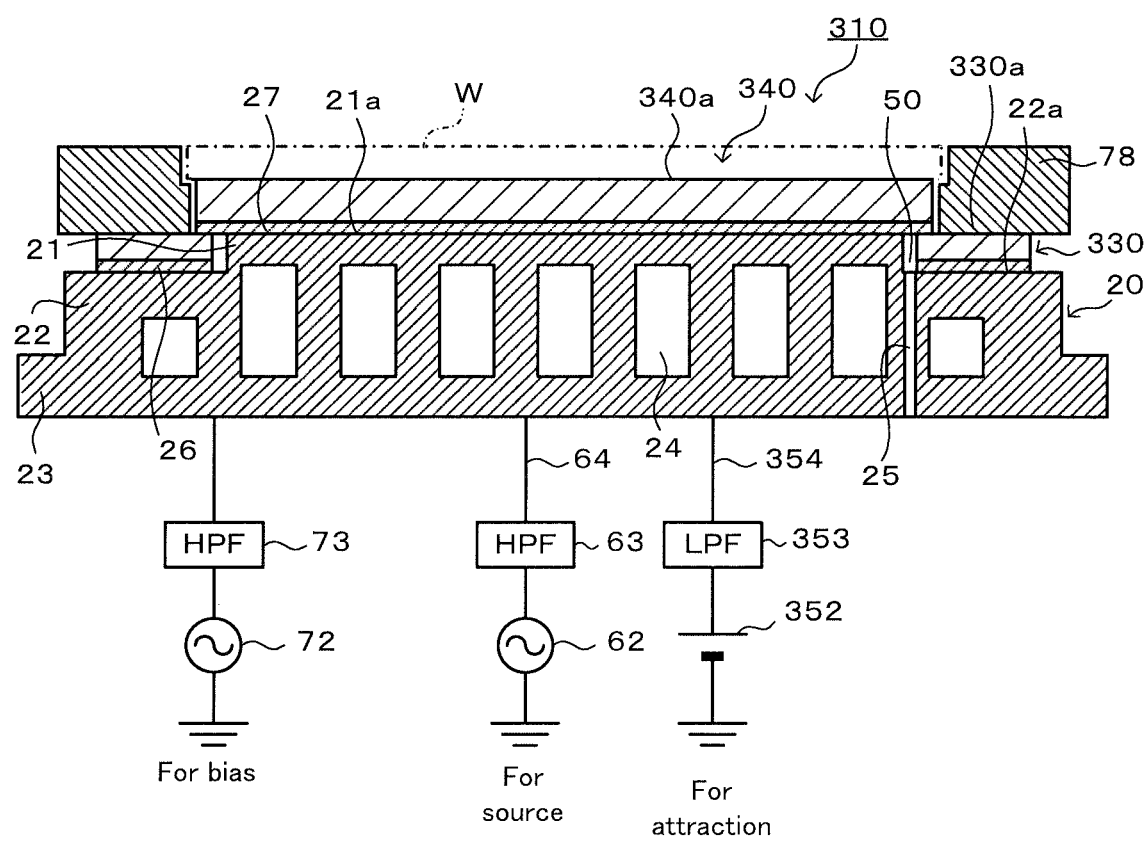
FIG. 12 is a vertical cross-sectional view of a member 310 for a semiconductor manufacturing apparatus.

Alternatively, as in a member 310 for a semiconductor manufacturing apparatus shown in FIG. 12, electrodes may not be built in a wafer placement table 340 and a FR placement table 330. In FIG. 12, structural elements that are the same those of the embodiments above are given the same reference numerals. A direct-current voltage of a common attraction power source 352 serving as a wafer attraction power source and a FR attraction power source is applied to a base substrate 20 through a feeder member 354. A LPF 353 is provided between the base substrate 20 and the attraction power source 352. An RF voltage of a source RF power source 62 and an RF voltage of a bias RF power source 72 are applied to the base substrate 20. The thickness of the wafer placement table 340 can be made smaller than the thickness of the wafer placement table 40 in FIG. 1 and the thickness of the wafer placement table 240 in FIG. 11. The thickness of the FR placement table 330 can be made smaller in accordance with the distance between a wafer-placement-table support surface 21a and a FR-placement-table support surface 22a. The thickness of the wafer placement table 340 and the thickness of the FR placement table 330 are preferably 1 mm or less. This makes it possible to electrostatically attract a wafer W to a wafer placement surface 340a and to electrostatically attract a focus ring 78 to a FR placement surface 330a. When the bias RF voltage is applied to the base substrate 20, the reactance between the wafer W and the circular joined layer 27 whose electrical potential becomes the same as that of the base substrate 20 and the reactance between the focus ring 78 and the ring-shaped joined layer 26 whose electrical potential becomes the same as that of the base substrate 20 are small. Therefore, it is possible to efficiently bring ions into the wafer W and bring ions into the focus ring 78 by using the bias RF voltage. Further, since it is not necessary to build in electrodes in the wafer placement table 340 and the FR placement table 330, the structure is simplified and a through hole for supplying electric power to built-in electrodes is not required, as a result of which a singular point of temperature can be suppressed from being generated. The thickness of the focus ring 78 is determined in accordance with the distance between the FR placement surface 330a and the wafer placement surface 340a. Therefore, when the life of the focus ring 78 is to be increased, the distance only needs to be increased. Note that, in FIG. 12, instead of the base substrate 20, the base substrate 120 in FIG. 10 that does not have a refrigerant flow path may be used.

Figure 13:
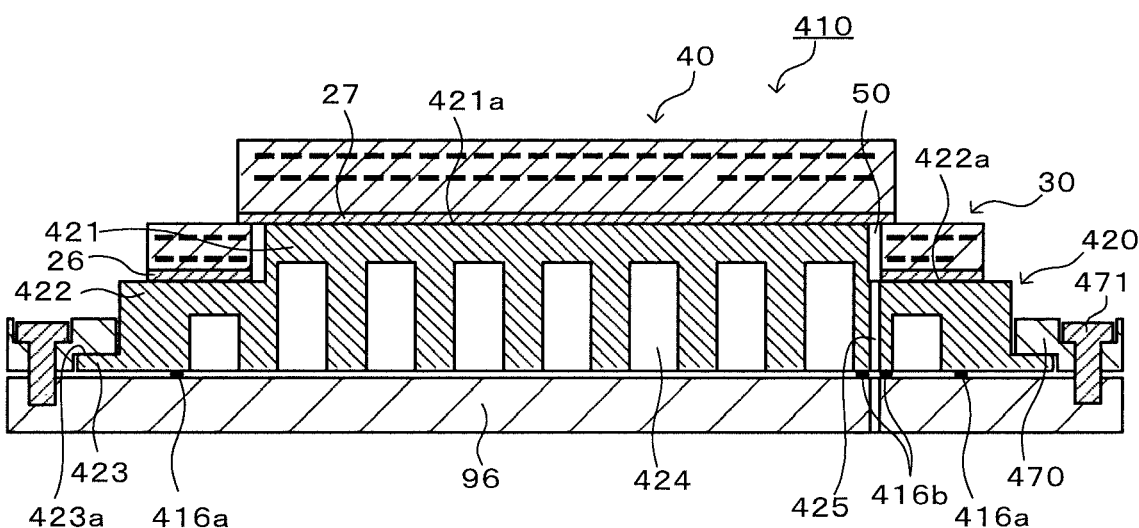
FIG. 13 is a vertical cross-sectional view of a member 410 for a semiconductor manufacturing apparatus.

Instead of the base substrate 20 of the embodiment above, a base substrate 420 shown in FIG. 13 may be used. In FIG. 13, structural elements that are the same those of the embodiments above are given the same reference numerals. In a member 410 for a semiconductor manufacturing apparatus in FIG. 13, a base substrate 420 has a ring-shaped FR-placement-table support 422 at an outer periphery of a wafer-placement-table support 421, and a flange portion 423 at an outer periphery of the FR-placement-table support 422, the FR-placement-table support 422 including a FR-placement-table support surface 422a at a height that is lower than that of a wafer-placement-table support surface 421a, the flange portion 423 including a flange surface 423a at a height that is lower than that of the FR-placement-table support surface 422a. The base substrate 420 has a refrigerant flow path groove 424. The refrigerant flow path groove 424 is provided so as to open in a lower surface of the base substrate 420. The base substrate 420 is fixed to an installation plate 96 in a chamber through seal members 416a and 416b. The seal member 416a is a ring-shaped member that has a diameter slightly smaller than that of the base substrate 420 and that surrounds the entire refrigerant flow path groove 424, and the seal member 416b is a ring-shaped member that surrounds a communication path 425 that communicates with an internal space 50. The flange portion 423 of the base substrate 420 is pushed against the installation plate 96 by screwing a bolt 471 inserted in the clamp member 470 into a threaded hole in the installation plate 96. Therefore, the seal members 416a and 416b exhibit sealability by being flattened. An opening of the refrigerant flow path groove 424 becomes a refrigerant flow path by being closed by the seal members 416a and 416b and the installation plate 96. Compared with the base substrate 20, only a small amount of material is needed for the base substrate 420, and thus costs can be kept low.

Figure 14:
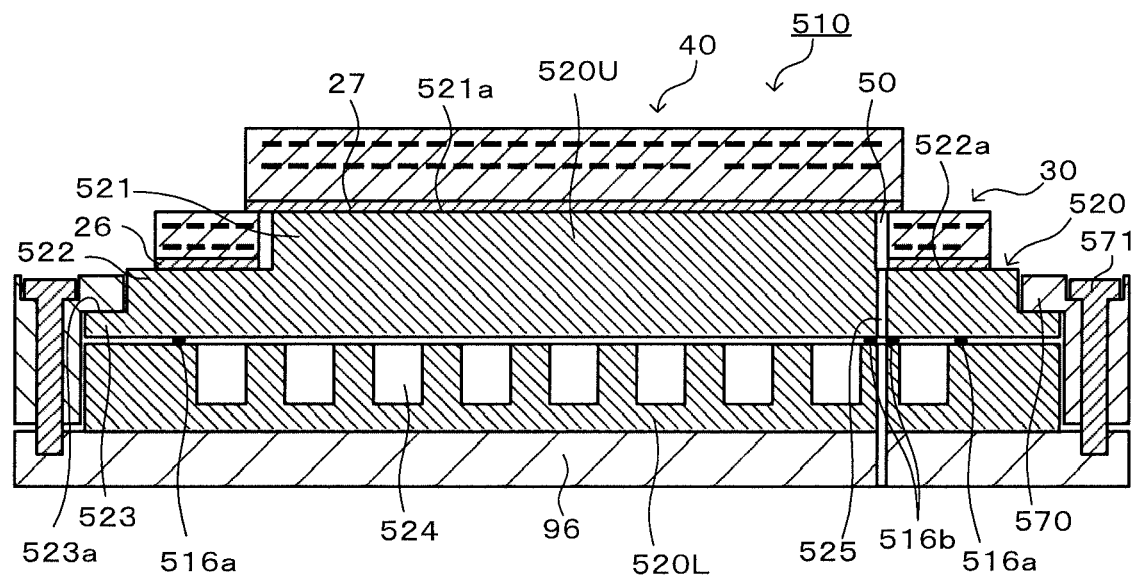
FIG. 14 is a vertical cross-sectional view of a member 510 for a semiconductor manufacturing apparatus.

Alternatively, instead of the base substrate 20 of the embodiment above, a base substrate 520 shown in FIG. 14 may be used. In FIG. 14, structural elements that are the same those of the embodiments above are given the same reference numerals. In a member 510 for a semiconductor manufacturing apparatus in FIG. 14, a base substrate 520 is one in which a base-substrate upper portion 520U and a base-substrate lower portion 520L are clamped through seal members 516a and 516b. The base-substrate upper portion 520U has a ring-shaped FR-placement-table support 522 at an outer periphery of a wafer-placement-table support 521, and a flange portion 523 at an outer periphery of the FR-placement-table support 522, the FR-placement-table support 522 including a FR-placement-table support surface 522a at a height that is lower than that of a wafer-placement-table support surface 521a, the flange portion 523 including a flange surface 523a at a height that is lower than that of the FR-placement-table support surface 522a. The base-substrate upper portion 520U does not have a refrigerant flow path. The base-substrate lower portion 520L has a refrigerant flow path groove 524. The refrigerant flow path groove 524 is provided so as to open in an upper surface of the base-substrate lower portion 520L. The seal member 516a is a ring-shaped member that has a diameter slightly smaller than that of the base-substrate lower portion 520L and that surrounds the entire refrigerant flow path groove 524, and the seal member 516b is a ring-shaped member that surrounds a communication path 525 that communicates with an internal space 50. The flange portion 523 of the base-substrate upper portion 520U is pushed against an installation plate 96 by screwing a bolt 571 inserted in the clamp member 570 into a threaded hole in the installation plate 96. Therefore, the seal members 516a and 516b exhibit sealability by being flattened. An opening of the refrigerant flow path groove 524 becomes a refrigerant flow path by being closed by the seal members 516a and 516b and the base-substrate upper portion 520U. In this case, the base-substrate upper portion 520U can be made of MMC, and the base-substrate lower portion 520L can be made of an easily workable material that is easily worked than MMC. As workability indices, for example, machinability indices in JIS B 0170 (2020) can be used. The easily workable material is preferably a material whose machinability index is 40 or greater, more preferably a material whose machinability index is 100 or greater, and even more preferably a material whose machinability index is 140 or greater. The easily workable material is, for example, aluminum, an aluminum alloy, stainless steel (SUS material), or a resin (a heat-resistant resin).

In the embodiments above, although the ring-shaped joined layer 26 and the circular joined layer 27 are metal joined layers, the present invention is not limited thereto. For example, instead of metal joined layers, resin joined layers may be used.

If necessary, a heater electrode (resistance heating element) may be built in the wafer placement table 40 and the FR placement table 30 of the embodiments above.

In the embodiments above, the ceramic wafer placement table 40 and the ceramic FR placement table 30 are formed by subjecting molded bodies containing ceramic powder to hot-press firing. However, the molded bodies at this time may be formed by stacking a plurality of tape molded bodies, or may be formed by a mold-cast method, or may be formed by pressing together ceramic powder.

In the embodiments above, although the base substrate 20 includes a refrigerant flow path 24 that is formed in a one-stroke pattern over the entire base substrate 20 in plan view, the present invention is not limited thereto. For example, the base substrate 20 may have a plurality of holes having a bottom and provided in the lower surface of the base substrate 20, and a refrigerant may be supplied to each hole.

In the embodiments above, a ring-shaped portion of the circular joined layer 27 opposing the internal space 50 may be eliminated. That is, the lower surface of the wafer placement table 40 may be exposed to the internal space 50.

The present application claims priority from Japanese Patent Application No. 2022-035115 filed on Mar. 8, 2022, the entire contents of which are incorporated herein by reference.

What is claimed is:

1. A member for a semiconductor manufacturing apparatus, comprising:
   a conductive base substrate that has a wafer-placement-table support including a circular wafer-placement-table support surface, and that has a focus-ring-placement-table support at an outer periphery of the wafer-placement-table support, the focus-ring-placement-table support including a ring-shaped focus-ring-placement-table support surface at a height that is lower than a height of the wafer-placement-table support surface;
   an insulating focus-ring placement table that has, at an upper surface thereof, a ring-shaped focus-ring placement surface, and that is joined to the focus-ring-placement-table support surface;
   an insulating wafer placement table that has, at an upper surface thereof, a circular wafer placement surface, that is separate from the focus-ring placement table, that overlaps an inner peripheral portion of the focus-ring placement surface in plan view, and that is joined to the inner peripheral portion of the focus-ring placement surface and to the wafer-placement-table support surface;
   a ring-shaped internal space that is surrounded by a lower surface of the wafer placement table, an outer peripheral surface of the wafer-placement-table support of the base substrate, an inner peripheral surface of the focus-ring placement table, and the focus-ring-placement-table support surface of the base substrate; and
   a communication path that is provided at the base substrate and that causes the internal space and an outside of the base substrate to communicate with each other.

2. The member for a semiconductor manufacturing apparatus according to claim 1, wherein the wafer placement table closes an upper portion of the internal space.

3. The member for a semiconductor manufacturing apparatus according to claim 1, wherein the wafer placement table has a through hole extending from the internal space to the wafer placement surface.

4. The member for a semiconductor manufacturing apparatus according to claim 1, wherein the focus-ring placement table is joined to the focus-ring-placement-table support surface by a first joined layer,
   wherein the wafer placement table is joined to the wafer-placement-table support surface by a second joined layer, and
   wherein the first and second joined layers are each a metal joined layer.

5. The member for a semiconductor manufacturing apparatus according to claim 1, wherein the focus-ring placement surface and the wafer-placement-table support surface are at a same height.

6. The member for a semiconductor manufacturing apparatus according to claim 1, wherein the base substrate has a refrigerant flow path therein, and
   wherein a distance from a ceiling surface of the refrigerant flow path to the wafer-placement-table support surface is smaller than a distance from the ceiling surface of the refrigerant flow path to the focus-ring-placement-table support surface.

7. The member for a semiconductor manufacturing apparatus according to claim 1, wherein the base substrate has a refrigerant flow path therein, and
   wherein, of the refrigerant flow path, a wafer flow path corresponding to the wafer-placement-table support surface and a focus-ring flow path corresponding to the focus-ring-placement-table support surface are independently provided, and refrigerants of different systems are each supplied to a corresponding one of the wafer flow path and the focus-ring flow path.

8. The member for a semiconductor manufacturing apparatus according to claim 1, wherein the wafer placement table has separately built therein a wafer attraction electrode and a bias RF electrode, or has built therein a multi-purpose electrode serving as the wafer attraction electrode and the bias RF electrode,
   wherein the focus-ring placement table has separately built therein a focus-ring attraction electrode and a focus-ring RF bias electrode, or has built therein a multi-purpose electrode serving as the focus-ring attraction electrode and the focus-ring RF bias electrode, and
   wherein the base substrate serves as a source RF electrode.

9. The member for a semiconductor manufacturing apparatus according to claim 1, wherein the wafer placement table and the focus-ring placement table do not have an electrode built therein, and
   wherein the base substrate serves as a wafer attraction electrode, a focus-ring attraction electrode, a bias RF electrode, and a source RF electrode.

* * * * *